United States Patent
Ting et al.

(10) Patent No.: US 7,622,345 B2
(45) Date of Patent: Nov. 24, 2009

(54) METHOD FOR FORMING FULLY SILICIDED GATE ELECTRODES AND UNSILICIDED POLY RESISTORS

(75) Inventors: Steve Ming Ting, Bridgewater, NJ (US); Chih-Hao Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 600 days.

(21) Appl. No.: 11/254,226

(22) Filed: Oct. 18, 2005
(Under 37 CFR 1.47)

(65) Prior Publication Data

US 2008/0188053 A1  Aug. 7, 2008

Related U.S. Application Data

(63) Continuation of application No. 11/082,676, filed on Mar. 17, 2005, now abandoned.

(51) Int. Cl.
*H01L 21/8234* (2006.01)
*H01L 21/8244* (2006.01)

(52) U.S. Cl. ...................................... 438/238
(58) Field of Classification Search ............... 438/238; 257/E21.09
See application file for complete search history.

(56) References Cited

U.S. PATENT DOCUMENTS

| | | | |
|---|---|---|---|
| 4,877,755 A | 10/1989 | Rodder | |
| 5,909,617 A | 6/1999 | Manning et al. | |
| 6,100,173 A | 8/2000 | Gardner et al. | |
| 6,211,000 B1 | 4/2001 | Spikes et al. | |
| 6,365,481 B1 * | 4/2002 | Bonser et al. | 438/382 |
| 6,406,956 B1 | 6/2002 | Tsai et al. | |
| 6,562,718 B1 | 5/2003 | Xiang et al. | |
| 7,414,292 B2 | 8/2008 | Ema et al. | |
| 2002/0119631 A1 | 8/2002 | Tseng | |
| 2002/0127791 A1 | 9/2002 | Nanjo et al. | |
| 2004/0097032 A1 | 5/2004 | Yamanoue et al. | |
| 2005/0227440 A1 | 10/2005 | Ema et al. | |
| 2008/0280406 A1 | 11/2008 | Ema et al. | |

FOREIGN PATENT DOCUMENTS

CN  2001-250869  9/2001
WO  WO 2004/112139 A1  12/2004

OTHER PUBLICATIONS

B. Tavel et al., "Totally Silicided (CoSi2) Polysilicon: a novel approach to very low-reisistive gate (~2/Ω□) without metal CMP nor etching", 2001 IEEE, pp. IEDM 01-825-IEDM 828.

(Continued)

*Primary Examiner*—David S Blum
(74) *Attorney, Agent, or Firm*—Duane Morris LLP

(57) ABSTRACT

A method is disclosed for forming silicided gate electrodes and unsilicided poly resistors. After patterning a semiconductor material for the gate electrode and resistor structures, a first dielectric layer is used to protect a poly resistor that is not to be silicided, then a first silicidation is performed for partially siliciding the gate electrode of the transistor. If the gate electrode is thick, a second dielectric layer is used to protect the resistor that is not to be silicided, then a second silicidation is performed for fully siliciding the gate electrode.

20 Claims, 5 Drawing Sheets

OTHER PUBLICATIONS

Z. Krivokapic et al., "Nickel Silicide Metal Gate FDSOI Devices with Improved Gate Oxide Leakage", 2002 IEEE, pp. IEDM 271-IEDM 274.

J. Kedzierski et al, "Metal-gate FinFET and fully-depleted SOI devices using total gate silicidation", 2002 IEEE, pp. IEDM 247-IEDM 250.

Singapore Search Report. Issued by the Danish Patent & Trademark Office in related Application No. 200508500-6. Mailing date Nov. 26, 2008.

B. Tavel et al. "Totally Silicided (CoSi2) Poysilicon: a novel approach to very low-resistive gate (~2OHM) without metal CMP nor etching." 2001, pp. 37.5.1-37.5.4, IEEE.

Singapore Search Report dated Nov. 26, 2008 regarding SG Patent Application No. 200508500-6 dated Oct. 25, 2005. SG.

CN Office Action dated Aug. 1, 2008 regarding CN Publication No. 2001-250869. CN.

CN Office Action dated May 22, 2009. CN.

ULSI Technology, Y.S. Chang et al. Book Publisher: McGraw-Hill Education, p. 396. ISBN No. 0-07-114105-7.

\* cited by examiner

METHOD FOR FORMING FULLY SILICIDED GATE ELECTRODES AND UNSILICIDED POLY RESISTORS

This application is a continuation of U.S. patent application Ser. No. 11/082,676, filed Mar. 17, 2005, now abandoned which is expressly incorporated by reference herein in its entirety.

BACKGROUND

The present invention relates generally to integrated circuits, and more particularly to methods for fabricating integrated circuits. Still more particularly, the present invention relates to methods for forming fully silicided gate electrodes while also providing unsilicided resistors.

As technology becomes more advanced, the design of integrated circuits (ICs) becomes more complicated. To further increase performance and reduce cost, improvements to the structural design of the IC as well as the processing methods to fabricate the ICs are of paramount importance. For example, scaling to lower gate oxide thickness to achieve higher gate capacitance is required as transistor channel lengths are decreased in order for the gate electrode to maintain control of the channel. In doped poly-silicon gate electrodes, the finite solubility of dopant atoms places a lower limit on gate resistance and leads to the formation of a finite thickness space charge layer depleted of free charge carriers at the gate electrode/oxide interface. This insulating poly-depletion layer increases the effective oxide thickness, decreasing overall gate capacitance, and poses a severe limitation to device scaling.

Replacing the poly-silicon gate electrode with a metal gate electrode relieves the problem of poly-depletion due to the high carrier concentration available in the metal. However, metal gates face numerous challenging process integration issues including metal etch process development, thermal budget constraints, and metal contamination. One attractive option is to alloy a metal with a conventionally patterned poly-silicon gate electrode in its entirety to form a fully silicided gate electrode. Since conventional IC processes already rely on a single silicide formation process to concurrently fabricate contacts to poly gate electrodes and source/drains, a fully-silicided gate can potentially be integrated with minimal process modification.

In conventional IC fabrication, silicide contacts to the source/drains and the doped poly-silicon gate electrodes are formed after source/drain implants are annealed and before deposition of device passivating dielectric layer. Sputter deposition of a blanket metal film is followed by a thermal process to react the metal with exposed silicon areas on the wafer forming silicide contacts to the source/drain and the gate electrode. Since the source/drain silicide contact depth must be minimized to prevent excess junction leakage and the poly-silicon gate electrode is typically thicker than the depth of the source/drain silicide contact, only the top portion of the poly-silicon gate electrode is silicided. Excess unreacted metal including metal deposited on dielectric spacers and isolation is then removed by a wet etch. Since only areas with exposed silicon are silicided, the process is self-aligned, and often referred to as a salicide process.

The primary process modification required to form an IC with fully-silicided gate electrodes is to maintain shallow the source/drain silicide contacts while achieving full-silicidation of the gate electrodes. One method of decoupling source/drain silicidation from full gate silicidation is to perform the conventional silicidation followed by an additional silicidation of the gate alone. To prevent additional silicidation of the source/drains, the second silicidation is performed after dielectric layers are blanket deposited to passivate the source/drains and polished back to expose only the gate electrode.

In a conventional IC process the same doped poly-silicon layer used to form the gate electrode also serves to form poly silicon resistors which are of high value for various circuit designs. The resistivity of silicided polysilicon is substantially lower than that of un-silicided doped polysilicon, therefore it is desirable to use un-silicided doped polysilicon in order to minimize the chip surface area required to accommodate a resistor of a given resistor. In the conventional IC process, this is achieved by patterning an additional dielectric layer after source/drain implant and before silicidation in order to protect the polysilicon resistors from silicidation. In the full silicidation process, since there are two silicidation steps, additional measures must be taken to prevent silicidation of polysilicon resistors. As such, desirable in the art of IC fabrication are additional structural designs and processing methods that may enable and simplify concurrent formations of fully silicided gate electrodes and high resistance polysilicon resistors.

SUMMARY

In view of the foregoing, this invention provides a design and method that both enable and simplify concurrent formations of gate electrode and resistor 2.

In one embodiment, after patterning a semiconductor material for the gate electrode and resistor structures, a first dielectric layer is used to protect a poly resistor that is not to be silicided, then a first silicidation is performed for partially siliciding the gate electrode of the transistor. If the gate electrode is thick, a second dielectric layer is used to protect the resistor that is not to be silicided, then a second silicidation is performed for fully siliciding the gate electrode.

The construction and method of operation of the invention, however, together with additional objects and advantages thereof will be best understood from the following description of specific embodiments when read in connection with the accompanying drawings.

DESCRIPTION

In the following two embodiments, this present invention provides an improved method for the production of metal-oxide-semiconductor field-effect-transistor (MOSFET) integrated circuits (ICs). The improved design provides simultaneous production of both silicided MOSFETs and unsilicided polycrystalline silicon or amorphous silicon resistors. The sources and drains in the substrate of the MOSFETs are partially silicided. The polysilicon or amorphous silicon gates of the MOSFETs are fully silicided. In certain situations, the prevention of silicidation of the resistors requires a dielectric silicide-blocking layer, typically oxide, to block contact of a deposited metal layer with the polycrystalline or amorphous silicon material of the resistor.

Figure 1A:
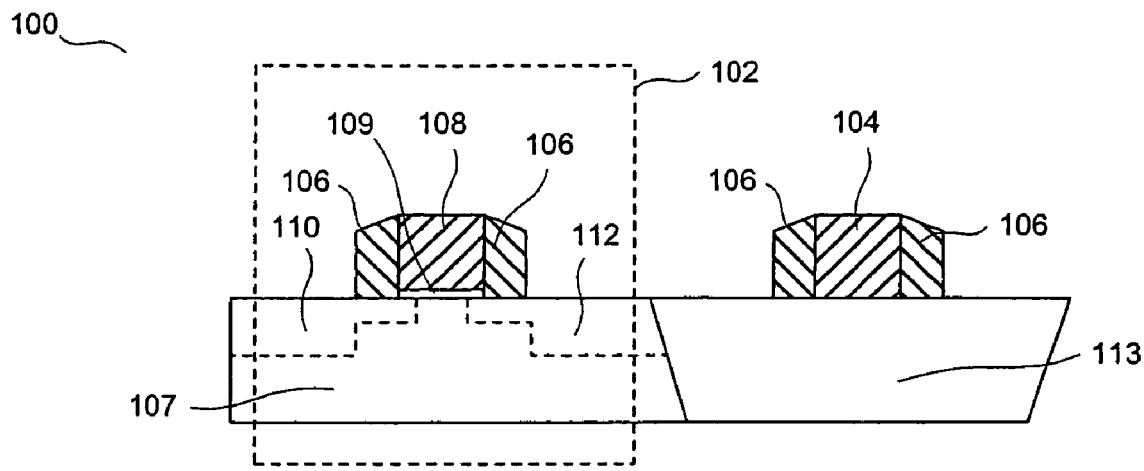
FIGS. 1A to 1E are partial sectional views of semiconductor structures that illustrate the processing steps required to fabricate a thin gate poly transistor in accordance with a first embodiment of the present invention.

FIGS. 1A to 1E are partial sectional views of semiconductor structures that illustrate the processing steps required to fabricate a thin gate poly transistor in accordance with a first embodiment of the present invention. When using the thin gate poly, the thickness thereof is preferred to be under 500 angstroms. FIG. 1A presents a partial sectional view 100 in accordance with the first embodiment of the present invention. The partial sectional view 100 includes a MOS transistor 102 and a resistor poly 104, both of which are formed and diffused with sidewall spacers 106. The MOS transistor 102 overlies a semiconductor substrate 107. The resistor poly 104 may or may not be diffused. The MOS transistor 102 includes a gate poly 108, that is deposited on a gate dielectric 109, that is preferably a thermally grown oxide, a source 110, and a drain 112. The resistor poly 104 overlies an isolation structure 113, such as shallow trench isolation (STI) or local oxidation of silicon. It is however understood by those skilled in the art that the positions of the source 110 and the drain 112 are typically interchangeable.

Figure 1B:
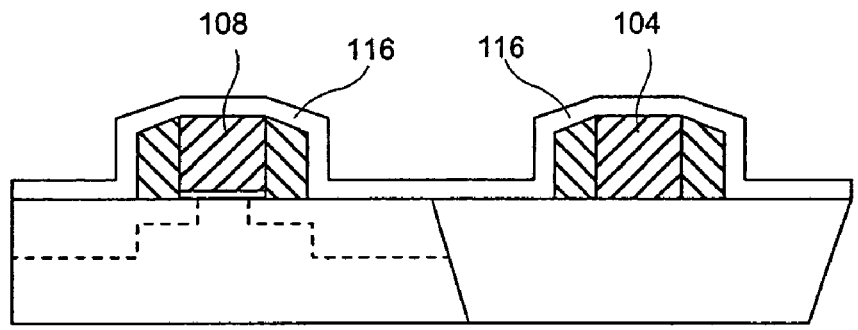

FIG. 1B presents a partial sectional view 114 in accordance with the first embodiment of the present invention. A first dielectric layer 116 is deposited onto both the gate poly 108 and the resistor poly 104. The first dielectric layer 116 is a silicide-blocking layer that may be made of one or more predetermined oxides.

Figure 1C:
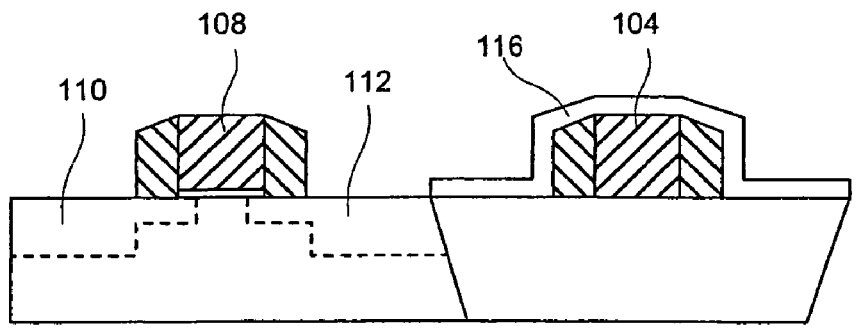

FIG. 1C presents a partial sectional view 118 in accordance with the first embodiment of the present invention. The first dielectric layer 116 is partially etched (for embodiment, using a wet etching process) from the gate poly 108, the source 110 and the drain 112. It is however noted that the first dielectric layer 116 remains on the resistor poly 104.

Figure 1D:
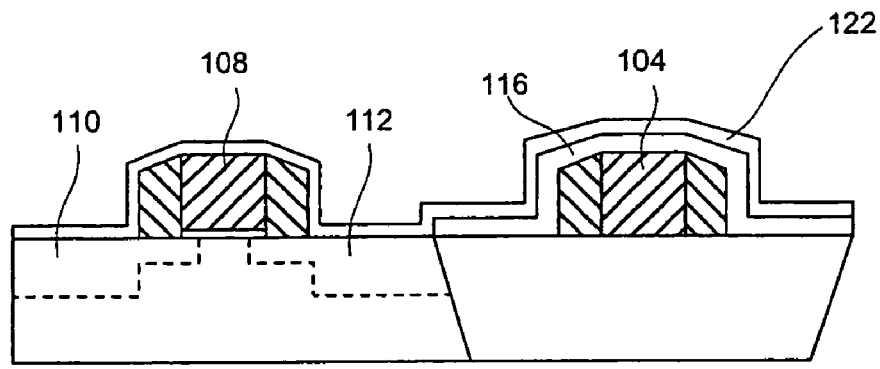

FIG. 1D presents a partial sectional view 120 in accordance with the first embodiment of the present invention. A first metal layer 122 is deposited on the gate poly 108, the source 110 and the drain 112, with the first dielectric layer 116 protecting the resistor poly 104.

Figure 1E:
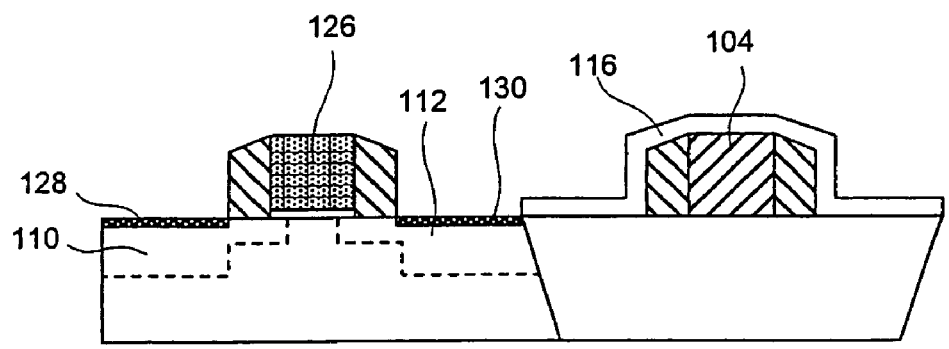

FIG. 1E presents a partial sectional view 124 in accordance with the first embodiment of the present invention. A high-temperature process alloys the first metal layer 122, shown in FIG. 1D, into the exposed silicon of the gate poly 108, shown in FIG. 1D, and the exposed silicon of both the source 110 and the drain 112. The result is the formation of a fully silicided thin gate poly 126, a silicided source 128, and a silicided drain 130. The first dielectric layer 116 protects the resistor poly 104 from the metal silicidation process. Excess, unalloyed metal is also removed in this step.

Figure 2A:
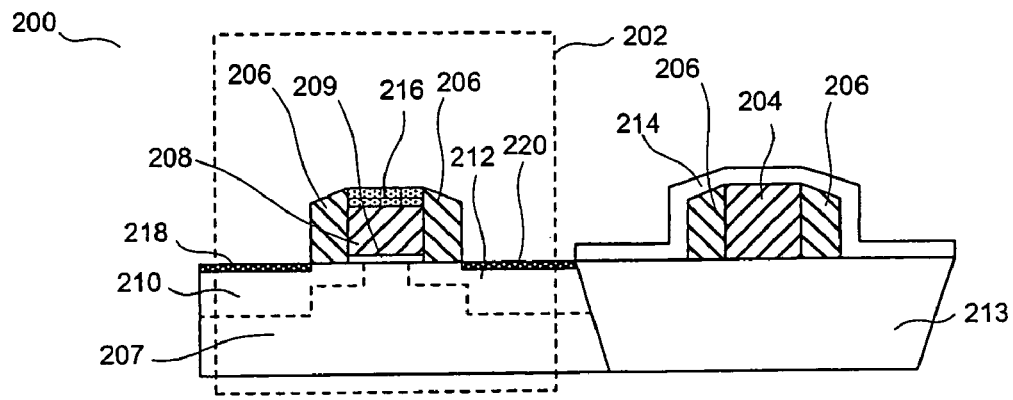
FIGS. 2A to 2G are partial sectional views of semiconductor structures that illustrate the extra processing steps required to fabricate a thick gate poly transistor in accordance with a second embodiment of the present invention.

FIGS. 2A to 2G are partial sectional views of semiconductor structures that illustrate extra processing required to fabricate a thick gate poly transistor in accordance with a second embodiment of the present invention. A thick gate poly is so defined when its thickness exceeds 500 angstroms. FIG. 2A presents a partial sectional view 200 in accordance with the second embodiment of the present invention. The partial sectional view 200 is formed by the processing steps as illustrated in FIGS. 1A through 1D, but with thick poly, and it includes the MOS transistor 202 and the resistor poly 204, both of which are formed and diffused with sidewall spacers 206. The MOS transistor 202 overlies a semiconductor substrate 207. The MOS transistor 202 includes a thick gate poly 208, which is deposited on a gate dielectric 209, a source 210, and a drain 212. The resistor poly 204 overlies an isolation structure 213, such as shallow trench isolation or local oxidation of silicon, and it is protected by the first dielectric layer 214.

After a first silicidation, the silicided upper portion 216 of the thick gate poly 208, the silicided source 218 and the silicided drain 220 are formed. While both FIGS. 1E and 2A illustrate a silicidation process, a smaller proportion of total thickness of the thick gate poly 208 is converted to silicide in FIG. 2A.

Figure 2B:
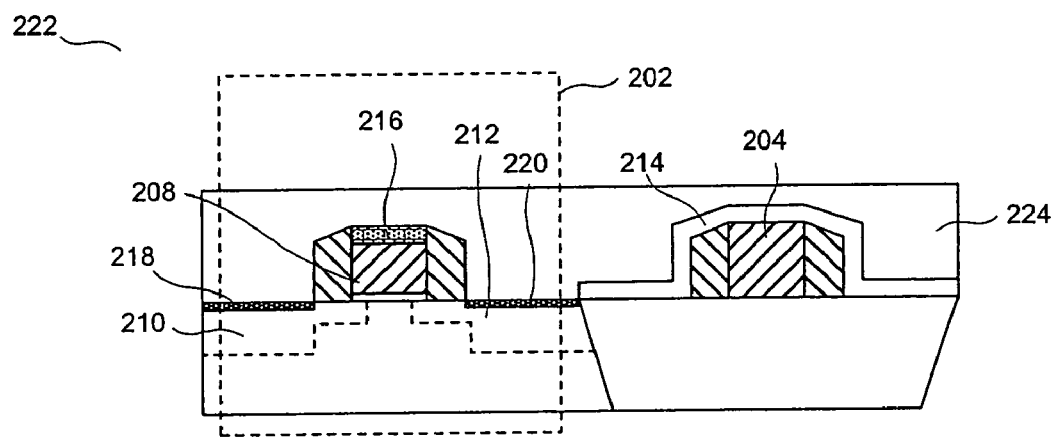

FIG. 2B presents a partial sectional view 222 in accordance with the second embodiment of the present invention. An inter-layer dielectric (ILD) layer 224 is first deposited. At this stage, it is understood that the thick gate poly 208 has the silicided upper portion 216, while the source 210 and the drain 212 of the MOS transistor 202 are fully silicided as silicided source 218 and silicided drain 220. Again, the resistor poly 204 is protected from this process by the first dielectric layer 214.

Figure 2C:
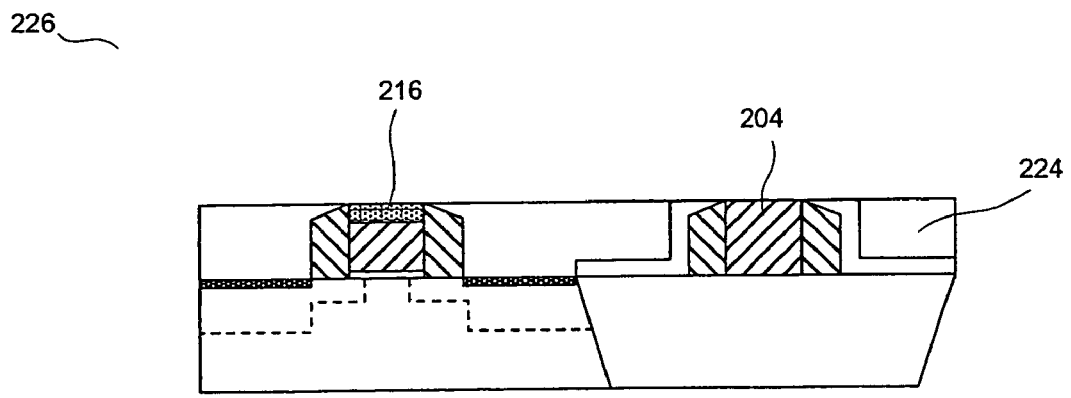

FIG. 2C presents a partial sectional view 226 in accordance with the second embodiment of the present invention. The ILD layer 224 is planarized by a planarization process such as a chemical-mechanical polish (CMP), thereby exposing the silicided upper portion 216 and the resistor poly 204.

Figure 2D:
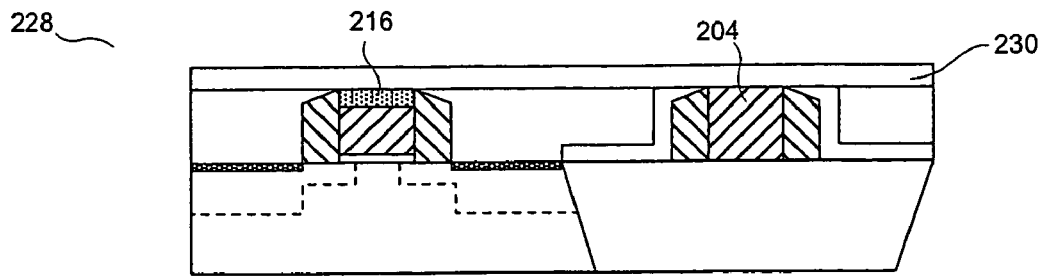

FIG. 2D presents a partial sectional view 228 in accordance with the second embodiment of the present invention. A second dielectric layer 230 is deposited onto both the silicided upper portion 216 and the resistor poly 204. The second dielectric layer 230 is effectively a silicide-blocking layer, typically oxide, which is used to block contact of a deposited metal layer with the polycrystalline or amorphous silicon body of the resistor.

Figure 2E:
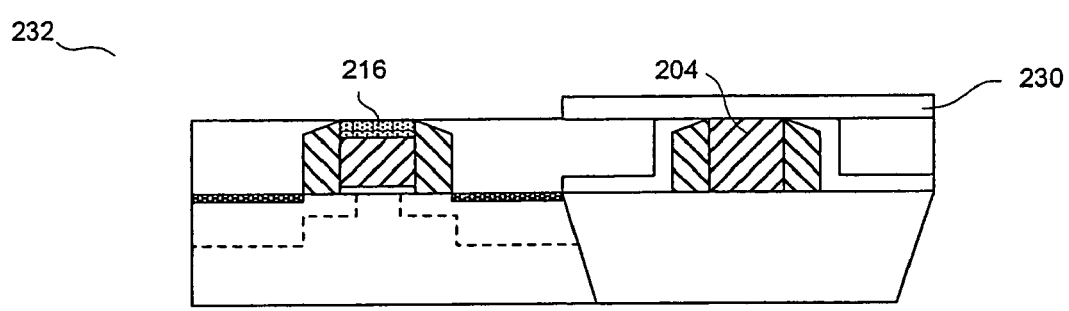

FIG. 2E presents a partial sectional view 232 in accordance with the second embodiment of the present invention. The second dielectric layer 230 is etched from the silicided upper portion 216, and is left protecting the resistor poly 204.

Figure 2F:
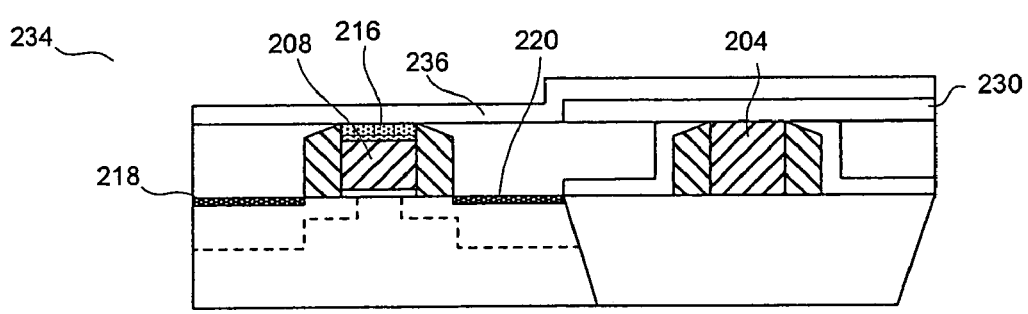

FIG. 2F presents a partial sectional view 234 in accordance with the second embodiment of the present invention. A second metal layer 236 is deposited on both the silicided upper portion 216 of the thick gate poly 208 and the remaining second dielectric layer 230. It is noted that the second metal layer 236 is in contact with none of the resistor poly 204, the silicided source 218, or the silicided drain 220.

Figure 2G:
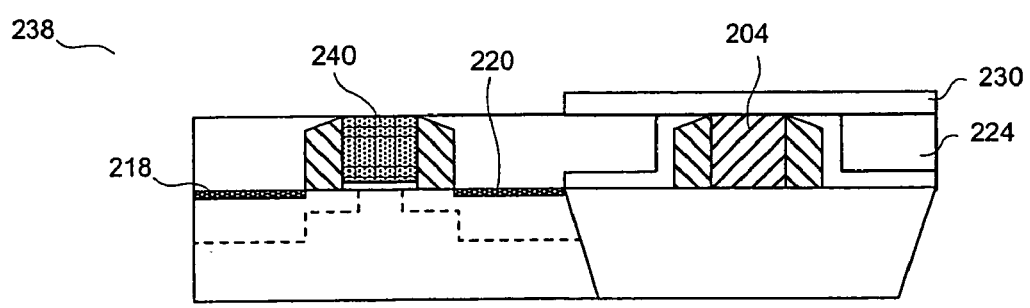

FIG. 2G presents a partial sectional view 238 in accordance with the second embodiment of the present invention. A second high-temperature process alloys the second metal layer 236, shown in FIG. 2F, into the silicided upper portion 216 of the thick gate poly 208, shown in FIG. 2F, thereby forming a fully silicided thick gate poly 240. Typically, about 90 percent of the thick gate poly 208/gate dielectric 209 interface area, shown in FIG. 2A, is silicided. The gate poly is now deemed to be fully silicided. Meanwhile, the silicided source 218 and the silicided drain 220 are protected from further silicidation by the ILD layer 224. The resistor poly 204 is not silicided because it is protected from this second alloy process by the second dielectric layer 230. Excess, unalloyed metal is removed from the ILD layer 224 and from the second dielectric layer 230. This second silicidation cycle (FIGS. 2B to 2G) continues from the earlier partial silicidation (FIG. 2A) of the gate poly, and achieves the expected full silicidation result.

Figure 3:
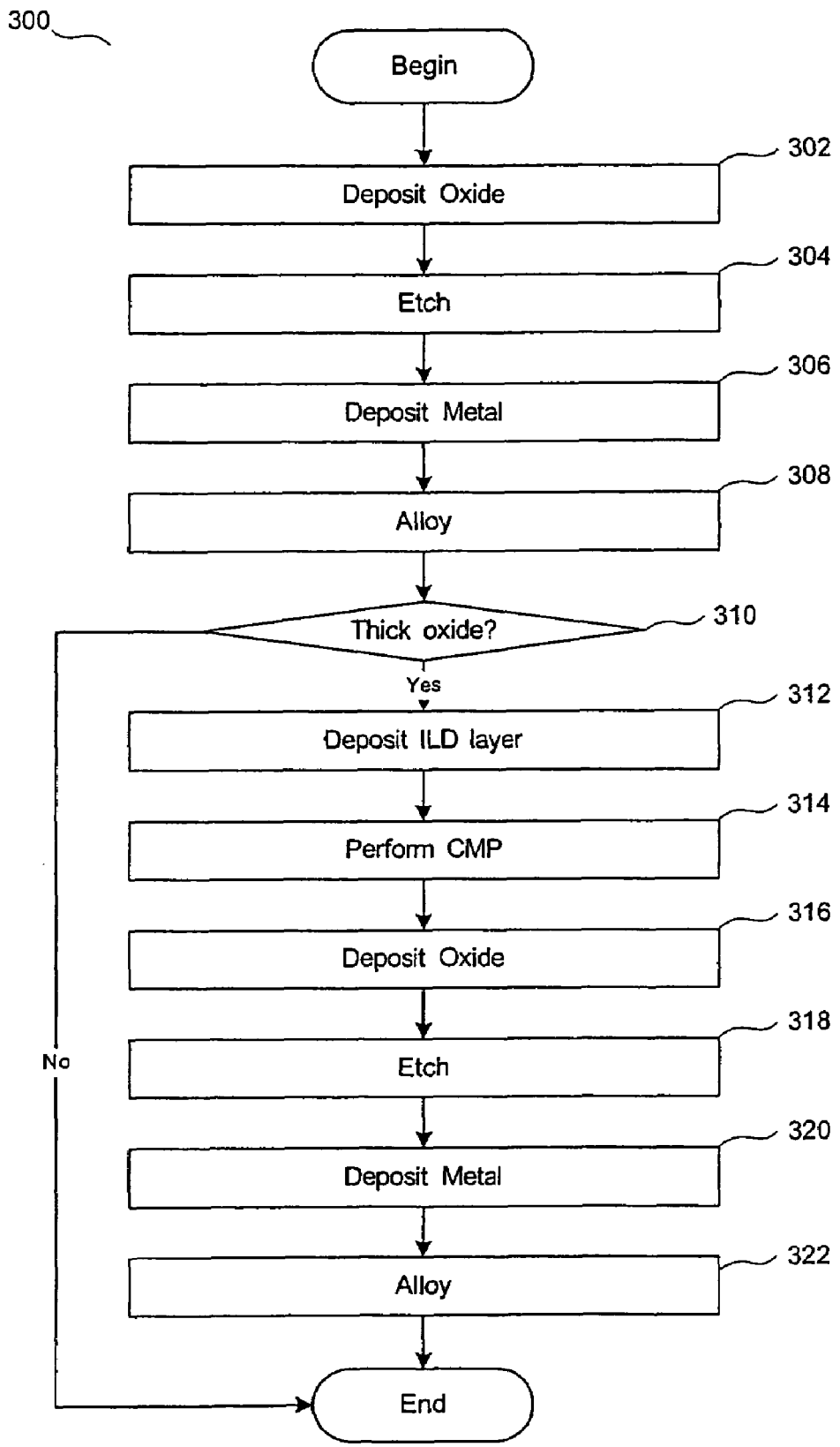
FIG. 3 presents a flow chart illustrating the processing steps in both the first and the second embodiments of the present invention.

FIG. 3 presents a flow chart 300 illustrating the processing steps in both the first and the second embodiments of the present invention. In step 302, the dielectric layer 116 is deposited, as also illustrated in FIG. 1B. In step 304, the dielectric layer 116 is etched from the MOS transistor 102, as also illustrated in FIG. 1C. In step 306, the first metal layer 122 is deposited on the gate poly 108, the source 110 and the drain 112, as also illustrated in FIG. 1D. In step 308, the high-temperature process alloys the first metal layer 122, thereby forming the fully silicided thin gate poly 126, the silicided source 128 and the silicided drain 130 as also illustrated in FIG. 1E. In step 310, it is determined whether the semiconductor device is a thin gate poly device or a thick gate poly device. If the semiconductor device is a thin gate poly device, the flow ends. By contrast, if the semiconductor device is a thick gate poly device (e.g., the thickness is more than 500 angstroms), the flow continues to step 312, where the ILD layer 224 is deposited as also illustrated in FIG. 2B. In step 314, the ILD layer 224 is planarized by CMP, thereby exposing the silicided upper portion 216 and the resistor poly 204, as also illustrated in FIG. 2C. In step 316, the second dielectric layer 230 is deposited onto both the silicided upper portion 216 and the resistor poly 204, as also illustrated in FIG. 2D. In step 318, the second dielectric layer 230 is etched away, thereby exposing the silicided upper portion 216, as also illustrated in FIG. 2E. In step 320, the second metal layer 236 is deposited on both the silicided upper portion 216 of the thick gate poly 208 and the remaining second dielectric layer 230, as also illustrated in FIG. 2F. In step 322, the high-temperature process alloys the second metal layer 236 with the thick gate poly 208, thereby completing the silicidation of the thick gate poly 208, as also illustrated in FIG. 2F. After excess metal may be etched away, a thick gate poly transistor device is fabricated.

The semiconductor substrate can be silicon, silicon/germanium, or germanium. The semiconductor substrate can be a bulk substrate or constructed as a semiconductor on insulator (SOI) substrate. The gate dielectric can be silicon dioxide, nitrogen containing silicon oxide, or a material with a dielectric constant >4. The metal silicide can be formed by alloying cobalt, nickel, cobalt/nickel, tungsten, platinum, zirconium, or titanium with a silicon substrate or poly. The resistor material can be poly or amorphous silicon, or silicon/germanium alloy with no silicide formation, as there is for the gate structure. The sidewall spacer can be formed of silicon dioxide, nitrogen containing dielectric, or a combination of the two. The silicide-block layer can be formed of a dielectric, such as, silicon dioxide, silicon nitride, nitrogen-containing dielectric or a similar material.

The above invention provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a transistor and unsilicided resistor on a semiconductor substrate, comprising:
    forming at least one gate electrode for the transistor and a resistor region using a semiconductor material;
    forming a first dielectric layer covering the resistor region;
    performing a first silicidation process for partially siliciding the gate electrode without siliciding the resistor region;
    forming a second dielectric layer covering the resistor region; and
    performing a second silicidation process for fully siliciding the gate electrode.

2. The method of claim 1 wherein the step of forming a second dielectric layer covering the resistor region comprises:
    forming a second dielectric layer covering both the transistor and the resistor region;
    removing a portion of the second dielectric layer for exposing the gate electrode and the resistor region;
    forming a third dielectric layer covering the exposed resistor region.

3. The method of claim 1 wherein the semiconductor substrate is a semiconductor on insulator (SOI) substrate.

4. The method of claim 1 wherein the semiconductor substrate is made of silicon, germanium, or silicon/germanium alloy.

5. The method of claim 1 further comprising forming a gate dielectric layer for the transistor on the semiconductor substrate before the forming at least one gate electrode.

6. The method of claim 5 wherein the gate dielectric layer is made of silicon oxide, nitrogen containing silicon oxide, or any dielectric material having a dielectric constant greater than 4.

7. The method of claim 1 further comprising forming an isolation structure in the semiconductor substrate.

8. The method of claim 7 wherein the resistor region overlies the isolation structure.

9. The method of claim 7 wherein the gate electrode overlies the semiconductor substrate at a location absent from the isolation structure.

10. The method of claim 1 wherein the semiconductor material is a polycrystalline silicon, amorphous silicon, or silicon/germanium alloy.

11. The method of claim 1 furthering comprising forming one or more spacers covering sidewalls of the gate electrode or the resistor region.

12. The method of claim 1 wherein the step of performing the first or second silicidation process further includes placing a metal layer on the gate electrode; and performing a high-temperature process for alloying the metal into the gate electrode.

13. The method of claim 12 wherein the metal layer includes nickel, cobalt, tungsten, platinum, zirconium, titanium or an alloy thereof.

14. The method of claim 1 wherein the gate electrode is at least 90 percent silicided after the second silicidation process.

15. The method of claim 1 wherein the gate electrode has a thickness of more than 500 angstroms.

16. The method of claim 1 wherein the first or third dielectric layer includes a nitrogen containing dielectric material.

17. The method of claim 1, wherein the semiconductor substrate is a bulk substrate.

18. The method of claim 11 wherein the spacer is made of silicon oxide or a nitrogen containing dielectric material.

19. A method for forming a transistor and unsilicided resistor on a semiconductor substrate, comprising:
    forming at least one gate electrode for the transistor and a resistor region using a semiconductor material;
    forming a first dielectric layer covering the resistor region;
    performing a first silicidation process for partially siliciding the gate electrode without siliciding the resistor region;
    forming a second dielectric layer covering the resistor region; and
    performing a second silicidation process for siliciding the gate electrode after forming the second dielectric.

20. The method of claim 19, wherein the second silicidation process includes completing silicidation of about 90% of the gate electrode.

* * * * *